(12) United States Patent
Hayashi et al.

(10) Patent No.: US 12,015,247 B2
(45) Date of Patent: Jun. 18, 2024

(54) OPTICAL TRANSMISSION APPARATUS

(71) Applicant: Mitsubishi Electric Corporation, Tokyo (JP)

(72) Inventors: Shusaku Hayashi, Tokyo (JP); Satoshi Nishikawa, Tokyo (JP); Koichi Akiyama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 590 days.

(21) Appl. No.: 17/283,543

(22) PCT Filed: Dec. 5, 2019

(86) PCT No.: PCT/JP2019/047675
§ 371 (c)(1),
(2) Date: Apr. 8, 2021

(87) PCT Pub. No.: WO2020/137422
PCT Pub. Date: Jul. 2, 2020

(65) Prior Publication Data
US 2021/0391694 A1 Dec. 16, 2021

(30) Foreign Application Priority Data
Dec. 25, 2018 (JP) .................................. 2018-241509

(51) Int. Cl.
*H01S 5/343* (2006.01)
*G02F 1/025* (2006.01)
(Continued)

(52) U.S. Cl.
CPC .............. *H01S 5/343* (2013.01); *G02F 1/025* (2013.01); *G02F 1/212* (2021.01); *H01S 5/50* (2013.01);
(Continued)

(58) Field of Classification Search
CPC .......... H01S 5/343; H01S 5/50; H01S 5/1007; H01S 5/0265; H01S 5/2224;
(Continued)

(56) References Cited

U.S. PATENT DOCUMENTS 5,168,534 A * 12/1992 McBrien ............ G02B 6/12004
385/2
5,375,135 A    12/1994 Okumura et al.
(Continued)

FOREIGN PATENT DOCUMENTS

EP    0772267 A1    5/1997
JP    7-22692 A     1/1995
(Continued)

OTHER PUBLICATIONS

International Search Report and Written Opinion dated Mar. 3, 2020, received for PCT Application PCT/JP2019/047675, Filed on Dec. 5, 2019, 10 pages including English Translation.

*Primary Examiner* — Vu A Vu
(74) *Attorney, Agent, or Firm* — XSENSUS LLP

(57) ABSTRACT

An optical transmission apparatus includes a first multilevel optical phase modulator and a first semiconductor optical amplifier. The first semiconductor optical amplifier includes a first active region having a first multiple quantum well structure. Assuming that a first number of layers of a plurality of first well layers is defined as $n_1$ and a first length of the first active region is defined as $L_1$ (μm): (a) $n_1=5$ and $400 \leq L_1 \leq 563$; (b) $n_1=6$ and $336 \leq L_1 \leq 470$; (c) $n_1=7$ and $280 \leq L_1 \leq 432$; (d) $n_1=8$ and $252 \leq L_1 \leq 397$; (e) $n_1=9$ and $224 \leq L_1 \leq 351$; or (f) $n_1=10$ and $200 \leq L_1 \leq 297$.

11 Claims, 11 Drawing Sheets

(51) Int. Cl.
*G02F 1/21* (2006.01)
*H01S 5/50* (2006.01)
*H04B 10/556* (2013.01)
*H01S 5/10* (2021.01)

(52) U.S. Cl.
CPC ....... *H04B 10/556* (2013.01); *G02F 2203/70* (2013.01); *H01S 5/1007* (2013.01)

(58) Field of Classification Search
CPC ........ H01S 5/2275; G02F 1/025; G02F 1/212; G02F 2203/70; G02F 1/01708; H04B 10/556; H04B 10/505
USPC ....................................................... 372/43.01
See application file for complete search history.

(56) References Cited

U.S. PATENT DOCUMENTS

| | | | | |
|---|---|---|---|---|
| 7,257,283 | B1 * | 8/2007 | Liu | G02B 6/12004 385/24 |
| 7,366,362 | B2 * | 4/2008 | Tanimura | H04B 10/50572 359/239 |
| 7,715,732 | B2 * | 5/2010 | Koh | G02F 1/0123 398/198 |
| 7,859,745 | B2 * | 12/2010 | Tanaka | H01S 5/5009 359/344 |
| 8,306,375 | B2 * | 11/2012 | Kato | B82Y 20/00 372/4 |
| 8,582,981 | B2 * | 11/2013 | Akiyama | H04B 10/5053 398/195 |
| 8,760,752 | B2 * | 6/2014 | Chen | G02F 1/225 398/198 |
| 8,909,067 | B2 * | 12/2014 | Takeguchi | H04B 10/5053 398/198 |
| 9,002,145 | B2 * | 4/2015 | Sudo | H04B 10/50575 398/198 |
| 9,287,993 | B1 * | 3/2016 | Adleman | H04B 10/2575 |
| 2008/0310012 | A1 | 12/2008 | Tanaka et al. | |
| 2010/0202776 | A1 | 8/2010 | Kakitsuka et al. | |
| 2013/0208350 | A1 * | 8/2013 | Saito | H01S 5/12 359/341.1 |
| 2016/0291135 | A1 * | 10/2016 | Ando | G01S 7/4811 |
| 2017/0244491 | A1 | 8/2017 | Hayashi et al. | |

FOREIGN PATENT DOCUMENTS

| | | |
|---|---|---|
| JP | 9-83059 A | 3/1997 |
| JP | 9-129970 A | 5/1997 |
| JP | 2008-311536 A | 12/2008 |
| JP | 2014-7642 A | 1/2014 |
| JP | 2017-153068 A | 8/2017 |
| WO | 2009/001861 A1 | 12/2008 |

* cited by examiner

|  | GAIN(dB)@I=100mA | EVM(%) |
|---|---|---|
| EXAMPLE 1 ($n_1$=SEVEN LAYERS, $L_1$=350 μm) | 11.6 | 9.6 |
| EXAMPLE 2 ($n_1$=SIX LAYERS, $L_1$=350 μm) | 8.8 | 9.8 |
| EXAMPLE 3 ($n_1$=FIVE LAYERS, $L_1$=500 μm) | 9.4 | 9.6 |
| COMPARATIVE EXAMPLE ($n_1$=SIX LAYERS, $L_1$=500 μm) | 11.8 | 11.6 |

OPTICAL TRANSMISSION APPARATUS

CROSS-REFERENCE TO RELATED APPLICATIONS

The present application is based on PCT filing PCT/JP2019/047675, filed Dec. 5, 2019, which claims priority to JP 2018-241509, filed Dec. 25, 2018, the entire contents of each are incorporated herein by reference.

TECHNICAL FIELD

The present invention relates to an optical transmission apparatus.

BACKGROUND ART

Japanese Patent Laying-Open No. 2014-7642 (PTL 1) discloses an optical transmission apparatus including an optical I/Q modulator and a semiconductor optical amplifier (SOA). The semiconductor optical amplifier amplifies an optical signal output from the optical I/Q modulator.

CITATION LIST

Patent Literature

PTL 1: Japanese Patent Laying-Open No. 2014-7642

SUMMARY OF INVENTION

Technical Problem

In the optical transmission apparatus disclosed in PTL 1, when the semiconductor optical amplifier (SOA) amplifies the optical signal output from the optical I/Q modulator, the phase of the optical signal applied by the optical I/Q modulator may distort, thereby deteriorating the quality of the optical signal output from the optical transmission apparatus. The present invention has been made in light of the above-described problem. An object of the present invention is to provide an optical transmission apparatus that is capable of outputting an optical signal with improved quality and intensity and that is reduced in power consumption.

Solution to Problem

An optical transmission apparatus of the present invention includes a first multilevel optical phase modulator and a first semiconductor optical amplifier. The first semiconductor optical amplifier amplifies first signal light output from the first multilevel optical phase modulator. The first semiconductor optical amplifier includes a first active region. The first active region has a first multiple quantum well structure including a plurality of first well layers. Assuming that a first number of layers in the plurality of first well layers is defined as $n_1$ and a first length of the first active region is defined as $L_1$ (μm): (a) $n_1=5$ and $400 \leq L_1 \leq 563$; (b) $n_1=6$ and $336 \leq L_1 \leq 470$; (c) $n_1=7$ and $280 \leq L_1 \leq 432$; (d) $n_1=8$ and $252 \leq L_1 \leq 397$; (e) $n_1=9$ and $224 \leq L_1 \leq 351$; or (f) $n_1=10$ and $200 \leq L_1 \leq 297$.

Advantageous Effects of Invention

The optical transmission apparatus of the present invention is capable of improving the quality and the intensity of an optical signal output from the optical transmission apparatus and is reduced in power consumption.

DESCRIPTION OF EMBODIMENTS

Figure 1:
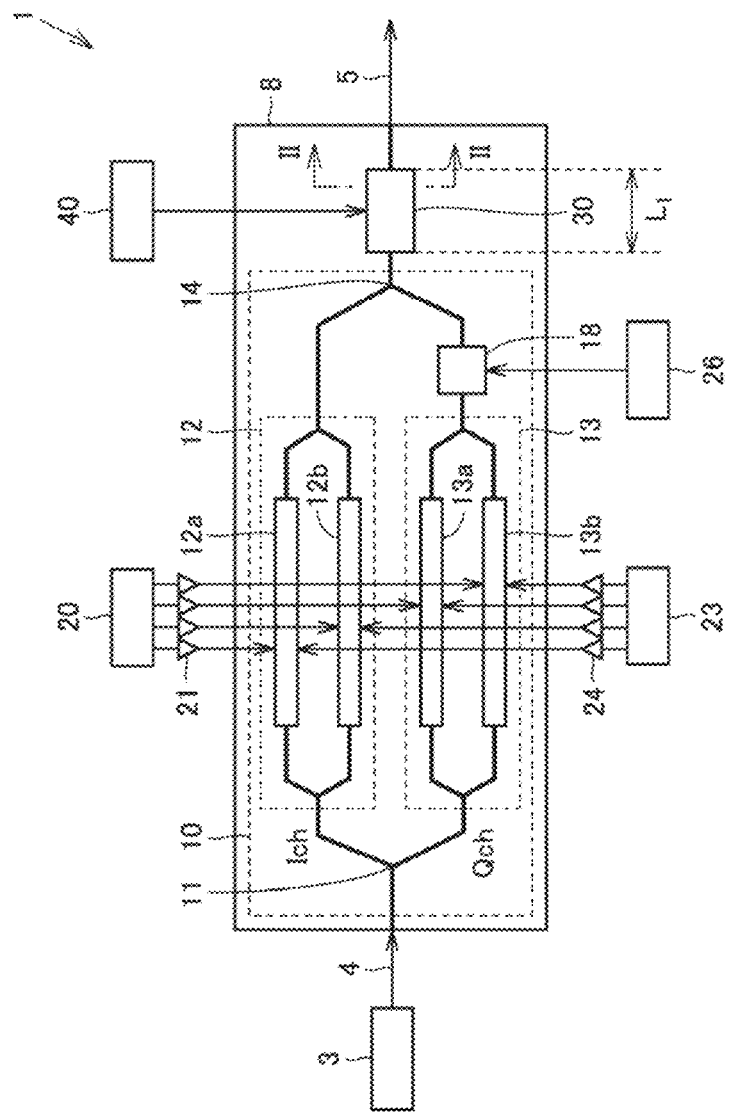
FIG. 1 is a schematic diagram of an optical transmission apparatus according to the first embodiment.

In the following, embodiments of the present invention will be described. The same configurations will be denoted by the same reference characters and the description thereof will not be repeated.

First Embodiment

Referring to FIG. 1, the configuration of an optical transmission apparatus 1 according to the first embodiment will be hereinafter described. Optical transmission apparatus 1 mainly includes a first multilevel optical phase modulator 10 and a first semiconductor optical amplifier 30. Optical transmission apparatus 1 further includes a laser light source 3. First multilevel optical phase modulator 10 and first semiconductor optical amplifier 30 may be formed on one semiconductor substrate 8. Semiconductor substrate 8 is a semi-insulating semiconductor substrate such as an Fe-doped InP substrate, or an n-type semiconductor substrate such as an n-type InP substrate, for example.

Laser light source 3 outputs continuous wave (CW) light 4 toward first multilevel optical phase modulator 10. Laser light source 3 is a semiconductor laser or a wavelength variable semiconductor laser, for example. In the present specification, the multilevel optical phase modulator means an optical modulator that outputs a multilevel optical signal having four or more values. The multilevel optical phase modulator provides, for example, quadrature phase-shift keying (QPSK), dual-polarization quadrature phase-shift keying (DP-QPSK), quadrature amplitude modulation (QAM) such as 4QAM, 8QAM or 16QAM, or dual polarization quadrature amplitude modulation (DP-QAM). In the present embodiment, optical transmission apparatus 1 (first multilevel optical phase modulator 10) has a function of a 16QAM modulator.

First multilevel optical phase modulator 10 includes a first optical demultiplexer 11, a first Mach-Zehnder optical phase modulator 12, a second Mach-Zehnder optical phase modulator 13, a first phase adjuster 18, and a first optical multiplexer 14.

First optical demultiplexer 11 is an optical demultiplexer that splits CW light 4 output from laser light source 3 into two beams of CW light 4. First optical demultiplexer 11 is, for example, a one-input and two-output (1×2) multimode interference (MMI) optical waveguide or a Y-branched optical waveguide. First optical demultiplexer 11 is a semiconductor optical waveguide. One of optical output portions of first optical demultiplexer 11 is optically connected to first Mach-Zehnder optical phase modulator 12. The other of the optical output portions of first optical demultiplexer 11 is optically connected to second Mach-Zehnder optical phase modulator 13. CW light 4 passes through first optical demultiplexer 11 and enters first Mach-Zehnder optical phase modulator 12 and second Mach-Zehnder optical phase modulator 13.

First Mach-Zehnder optical phase modulator 12 is a semiconductor Mach-Zehnder optical phase modulator. First Mach-Zehnder optical phase modulator 12 includes a pair of first electrodes 12a, 12b. A first modulation signal is applied to the pair of first electrodes 12a, 12b from a modulation signal generator 20. First Mach-Zehnder optical phase modulator 12 may be driven in a single phase or may be differentially driven. Driving in a single phase is a driving scheme in which one electrode (for example, a first electrode 12a) of a pair of electrodes is applied with an RF voltage while the other electrode (for example, a first electrode 12b) of the pair of electrodes is grounded. Differential driving is a driving scheme in which a pair of electrodes (for example, a pair of first electrodes 12a, 12b) are applied with differential RF voltages that are opposite in phase to each other. The first modulation signal output from a modulation signal generator 20 is amplified by a first electric amplifier 21. Modulation signal generator 20 is configured, for example, with a processor such as a digital signal processor (DSP).

The first bias voltage is applied to the pair of first electrodes 12a, 12b from a bias voltage controller 23. The first bias voltage output from bias voltage controller 23 is amplified by a second electric amplifier 24. The first modulation signal and the first bias voltage change the phase of CW light 4 propagating through first Mach-Zehnder optical phase modulator 12. First Mach-Zehnder optical phase modulator 12 outputs first phase modulation light. The first phase modulation light is an In-phase channel (Ich) optical signal that is a real part of signal light 5.

Second Mach-Zehnder optical phase modulator 13 is a semiconductor Mach-Zehnder optical phase modulator. Second Mach-Zehnder optical phase modulator 13 includes a pair of second electrodes 13a, 13b. The second modulation signal is applied to the pair of second electrodes 13a, 13b from modulation signal generator 20. Second Mach-Zehnder optical phase modulator 13 may be driven in a single phase or may be differentially driven. The second modulation signal output from modulation signal generator 20 is amplified by first electric amplifier 21.

The second bias voltage is applied to the pair of second electrodes 13a, 13b from bias voltage controller 23. The second bias voltage output from bias voltage controller 23 is amplified by second electric amplifier 24. The second modulation signal and the second bias voltage change the phase of CW light 4 propagating through second Mach-Zehnder optical phase modulator 13. Second Mach-Zehnder optical phase modulator 13 outputs the second phase modulation light. The second phase modulation light is a quadrature-phase channel (Qch) optical signal that is an imaginary part of signal light 5.

First phase adjuster 18 is disposed between second Mach-Zehnder optical phase modulator 13 and first optical multiplexer 14. First phase adjuster 18 is an optical phase adjuster that provides a phase difference (for example, π/2) between the first phase modulation light and the second phase modulation light. A phase adjustment voltage is applied to first phase adjuster 18 from a phase adjustment voltage controller 26. In the present embodiment, first phase adjuster 18 is provided between second Mach-Zehnder optical phase modulator 13 and first optical multiplexer 14, but first phase adjuster 18 may be provided between first Mach-Zehnder optical phase modulator 12 and first optical multiplexer 14, or may be provided between first Mach-Zehnder optical phase modulator 12 and first optical multiplexer 14 and between second Mach-Zehnder optical phase modulator 13 and first optical multiplexer 14.

First optical multiplexer 14 is an optical multiplexer that multiplexes the first phase modulation light and the second phase modulation light. First optical multiplexer 14 is, for example, a two-input and one-output (2×1) multimode interference (MMI) optical waveguide or a Y-junction multiplexing optical waveguide. First Mach-Zehnder optical phase modulator 12 is connected to one of optical input portions of first optical multiplexer 14. Second Mach-Zehnder optical phase modulator 13 is connected to the other of the optical input portions of first optical multiplexer 14. First optical multiplexer 14 multiplexes the first phase modulation light and the second phase modulation light that is adjusted in phase by first phase adjuster 18, and then, outputs signal light 5. First optical multiplexer 14 is a semiconductor optical waveguide.

First semiconductor optical amplifier 30 is a semiconductor optical amplifier that amplifies signal light 5. Thus, optical transmission apparatus 1 outputs signal light 5 that is an optical signal. An optical gain controller 40 controls the magnitude of the current injected into first semiconductor optical amplifier 30 to thereby control the gain of first semiconductor optical amplifier 30. Optical gain controller 40 may operate first semiconductor optical amplifier 30, for example, in a gain saturation region of first semiconductor optical amplifier 30. In the present specification, the gain saturation region means a current region in which the gain of the semiconductor optical amplifier is saturated when the current injected into the semiconductor optical amplifier is increased. The gain saturation region means a current region causing a gain that is 90% or more of the maximum value of the gain obtained in the semiconductor optical amplifier when the current injected into the semiconductor optical amplifier is increased.

Figure 2:
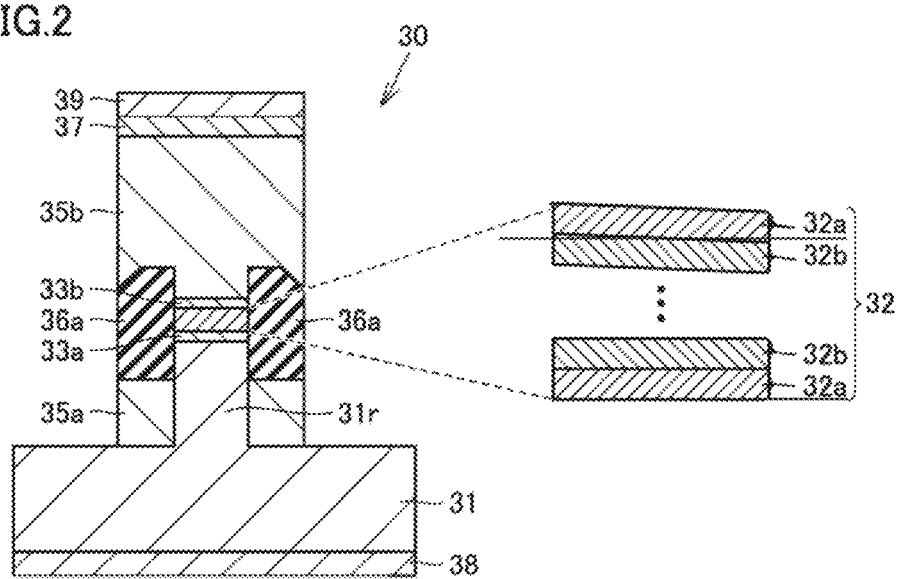
FIG. 2 is a schematic cross-sectional view of an optical transmission apparatus according to each of the first and third embodiments, which is taken along a cross-sectional line II-II shown in each of FIGS. 1, 13, 14, and 17.

Referring to FIG. 2, first semiconductor optical amplifier 30 includes, for example, an n-type semiconductor layer 31, a pair of light confinement layers 33a, 33b, a first active region 32, p-type semiconductor layers 35a, 35b, current blocking layers 36a, a p-type contact layer 37, an n-type electrode 38, and a p-type electrode 39. N-type semiconductor layer 31 may be a part of semiconductor substrate 8. Further, n-type semiconductor layer 31 is an n-InP layer, for example. Also, n-type semiconductor layer 31 includes a ridge portion 31r.

Light confinement layer 33a is provided on ridge portion 31r. First active region 32 is provided on light confinement layer 33a. Light confinement layer 33b is provided on first active region 32. First active region 32 is sandwiched between a pair of light confinement layers 33a, 33b. The pair of light confinement layers 33a, 33b confines signal light 5, which propagates through first semiconductor optical amplifier 30, mainly in the pair of light confinement layers 33a, 33b and first active region 32.

Further, p-type semiconductor layer 35b is provided on light confinement layer 33b. Both sides of a portion of ridge portion 31r proximate to n-type semiconductor layer 31 are embedded by p-type semiconductor layer 35a. In this case, p-type semiconductor layers 35a, 35b are p-InP layers, for example. Current blocking layers 36a are provided on p-type semiconductor layer 35a. The remaining portion of ridge portion 31r, the pair of light confinement layers 33a, 33b, first active region 32, and both sides of a portion of p-type semiconductor layer 35b are embedded by current blocking layers 36a. Current blocking layers 36a serve to concentrate the current, which flows between n-type electrode 38 and p-type electrode 39, in first active region 32. Current blocking layers 36a are n-InP layers or Fe-doped InP layers.

Furthermore, p-type semiconductor layer 35b is also provided on current blocking layers 36a. P-type contact layer 37 is provided on p-type semiconductor layer 35b. P-type contact layer 37 is a p-InGaAs layer. N-type electrode 38 is provided on the back surface of n-type semiconductor layer 31 (on the surface of n-type semiconductor layer 31 that is distant from first active region 32). P-type electrode 39 is provided on p-type contact layer 37. P-type electrode 39 is in ohmic contact with p-type contact layer 37.

First active region 32 has a first length $L_1$ (see FIG. 1) extending in the direction along which signal light 5 propagates. First length $L_1$ of first active region 32 is equal, for example, to the length of first semiconductor optical amplifier 30 extending in the direction along which signal light 5 propagates. First active region 32 includes a first multiple quantum well (MQW) structure. The first multiple quantum well structure includes a plurality of first well layers 32a and a plurality of first barrier layers 32b. The material of first well layer 32a is undoped InGaAsP, for example. The material of first barrier layer 32b is undoped InGaAsP, for example. The band gap energy of first well layer 32a is smaller than the band gap energy of first barrier layer 32b.

The quality of signal light 5 output from optical transmission apparatus 1 is evaluated based on the error vector magnitude (EVM). For example, in 16QAM modulation, when the EVM of signal light 5 output from optical transmission apparatus 1 is 10% or less, the quality of signal light 5 output from optical transmission apparatus 1 is evaluated as excellent. The light intensity of signal light 5 output from optical transmission apparatus 1 depends on the gain of first semiconductor optical amplifier 30. The quality and the light intensity of signal light 5 output from optical transmission apparatus 1 depend on the first number of layers $n_1$ of the plurality of first well layers 32a in first semiconductor optical amplifier 30 and first length $L_1$ (μm) of first active region 32.

Figure 3:
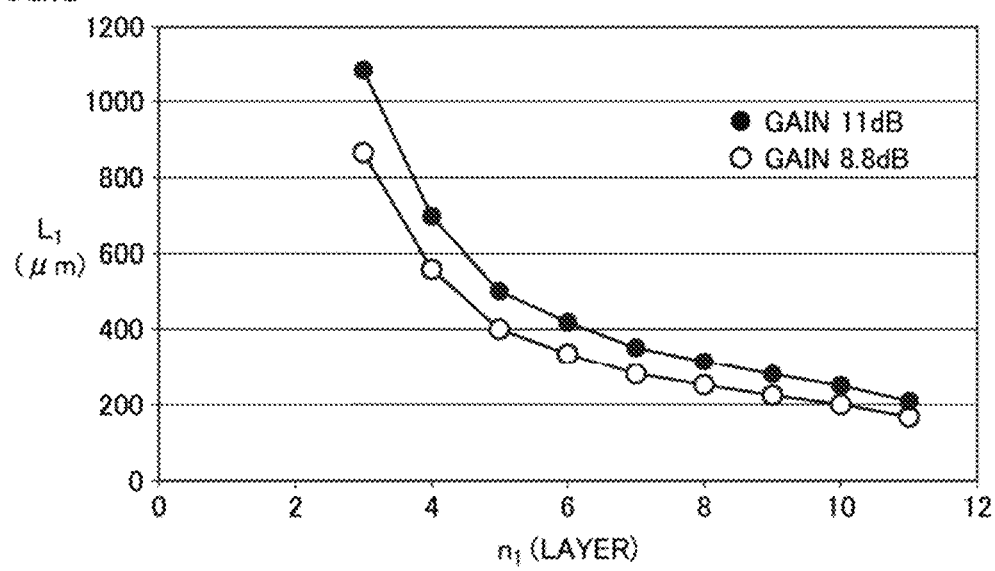
FIG. 3 is a graph showing: the relation between a first number of layers $n_1$ and a first length $L_1$ in which a first semiconductor optical amplifier obtains a gain of 11 dB when a current of 100 mA flows through the first semiconductor optical amplifier; and the relation between the first number of layers $n_1$ and first length $L_1$ in which the first semiconductor optical amplifier obtains a gain of 8.8 dB when a current of 100 mA flows through the first semiconductor optical amplifier, each of these relations being obtained by simulations.

FIG. 3 shows: the relation between the first number of layers $n_1$ and first length $L_1$ in which first semiconductor optical amplifier 30 obtains a gain of 11 dB when a current of 100 mA flows through first semiconductor optical amplifier 30; and the relation between the first number of layers $n_1$ and first length $L_1$ in which first semiconductor optical amplifier 30 obtains a gain of 8.8 dB when a current of 100 mA flows through first semiconductor optical amplifier 30. The above-mentioned relations were obtained by simulations conducted in consideration of: the internal loss in first semiconductor optical amplifier 30 in accordance with the first number of layers $n_1$ and first length $L_1$ of first semiconductor optical amplifier 30; the gain of first semiconductor optical amplifier 30 with respect to the injection current; and the transient response of the gain of first semiconductor optical amplifier 30 with respect to the input of the optical signal (for example, a 16QAM signal). In general, as the first number of layers $n_1$ increases, the gain of first semiconductor optical amplifier 30 increases. In general, as first length $L_1$ increases, the gain of first semiconductor optical amplifier 30 increases. As shown in FIG. 3, as the first number of layers $n_1$ increases, first length $L_1$ required for first semiconductor optical amplifier 30 to obtain a constant gain decreases.

In actuality, as the first number of layers $n_1$ increases above 10, the carriers injected into first semiconductor optical amplifier 30 are unevenly distributed in the thickness direction of first active region 32, so that the optical loss in first semiconductor optical amplifier 30 increases. Thus, the first number of layers $n_1$ is desirably 5 or more and 10 or less.

FIGS. 4 to 9 each show the relation between first length $L_1$ and the EVM of signal light 5 output from optical transmission apparatus 1, in which a current of 100 mA flows through first semiconductor optical amplifier 30 in each of the cases where the first numbers of layers $n_1$ are 5, 6, 7, 8, 9, and 10 that correspond to FIGS. 4, 5, 6, 7, 8, and 9, respectively. These relations were obtained by the simulations conducted in consideration of: the internal loss in first semiconductor optical amplifier 30 in accordance with the first number of layers $n_1$ and first length $L_1$ of first semiconductor optical amplifier 30; the gain of first semiconductor optical amplifier 30 with respect to the injection current; and the transient response of the gain of first semiconductor optical amplifier 30 with respect to the input of the optical signal (for example, a 16QAM signal).

Figure 4:
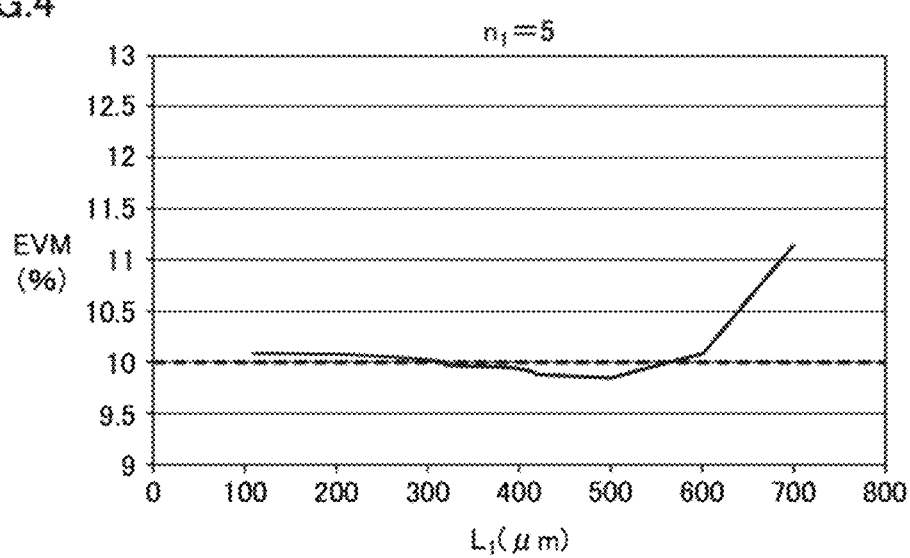
FIG. 4 is a graph showing the relation between first length $L_1$ and an EVM of signal light output from the optical transmission apparatus, in which the first number of layers $n_1$ is 5 and a current of 100 mA flows through the first semiconductor optical amplifier, the relation being obtained by simulations.
Figure 5:
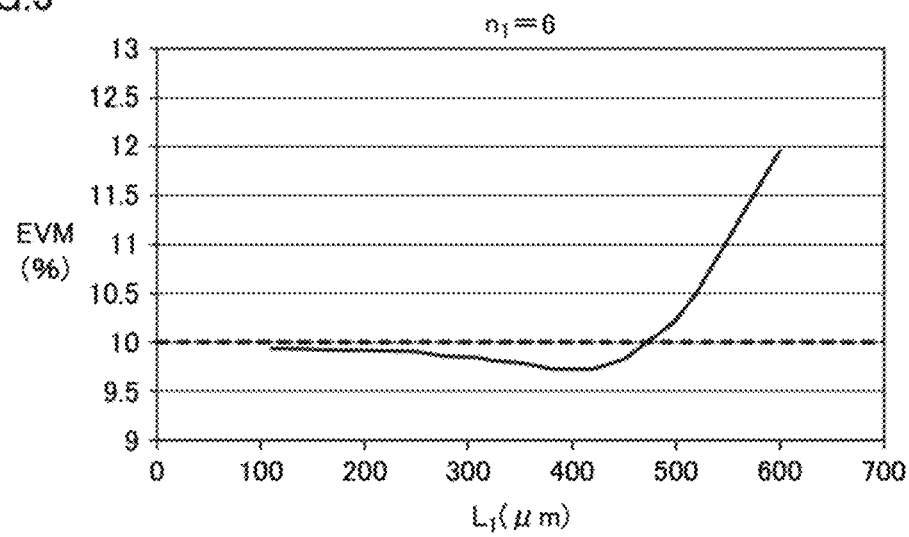
FIG. 5 is a graph showing the relation between first length $L_1$ and the EVM of the signal light output from the optical transmission apparatus, in which the first number of layers $n_1$ is 6 and a current of 100 mA flows through the first semiconductor optical amplifier, the relation being obtained by simulations.
Figure 6:
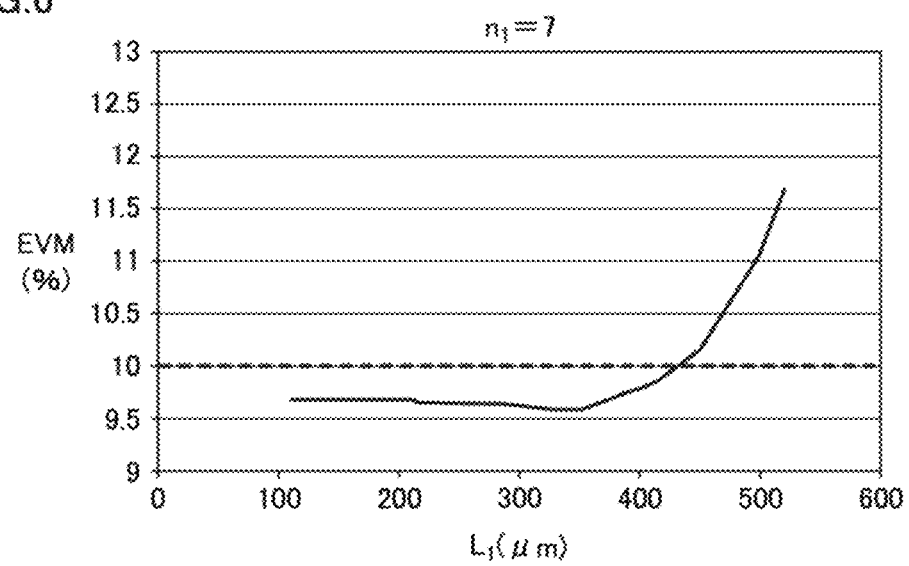
FIG. 6 is a graph showing the relation between first length $L_1$ and the EVM of the signal light output from the optical transmission apparatus, in which the first number of layers $n_1$ is 7 and a current of 100 mA flows through the first semiconductor optical amplifier, the relation being obtained by simulations.
Figure 7:
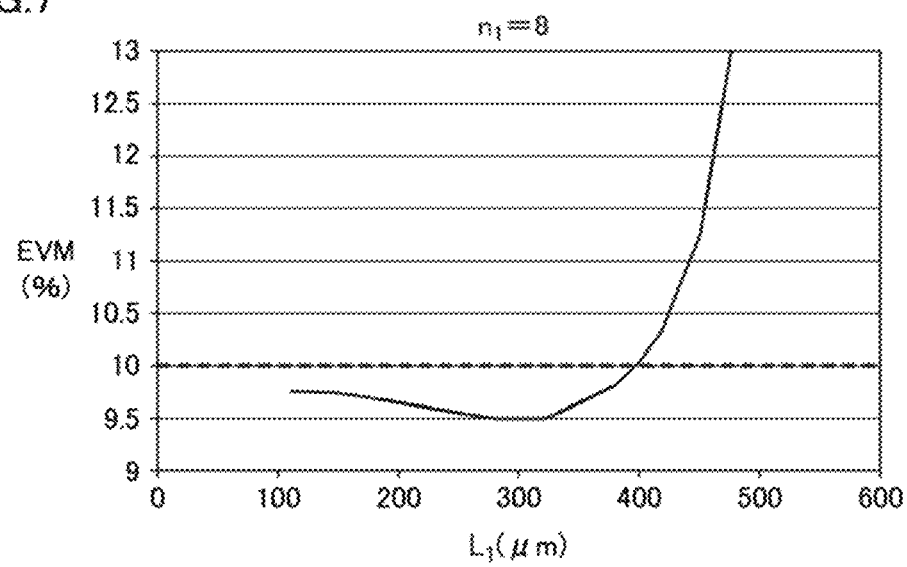
FIG. 7 is a graph showing the relation between first length $L_1$ and the EVM of the signal light output from the optical transmission apparatus, in which the first number of layers $n_1$ is 8 and a current of 100 mA flows through the first semiconductor optical amplifier, the relation being obtained by simulations.
Figure 8:
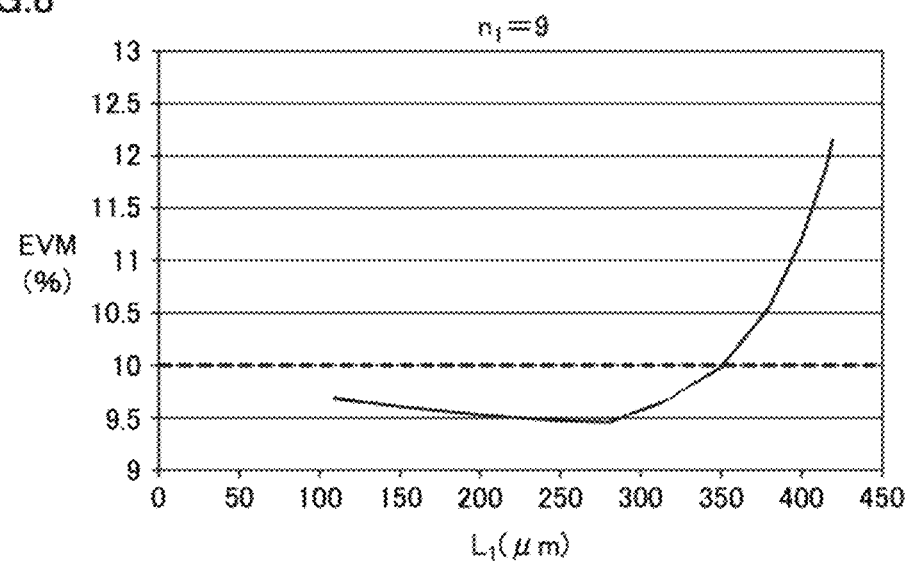
FIG. 8 is a graph showing the relation between first length $L_1$ and the EVM of the signal light output from the optical transmission apparatus, in which the first number of layers $n_1$ is 9 and a current of 100 mA flows through the first semiconductor optical amplifier, the relation being obtained by simulations.
Figure 9:
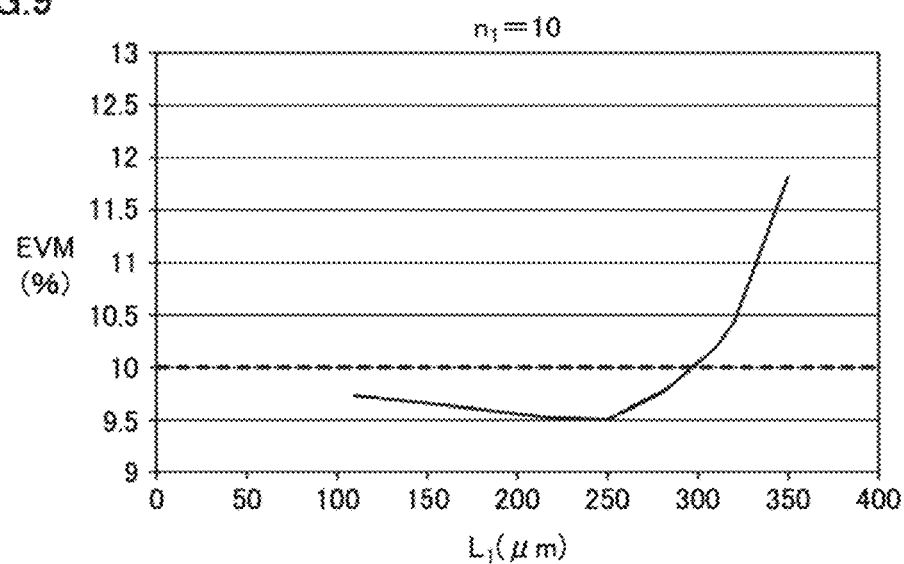
FIG. 9 is a graph showing the relation between first length $L_1$ and the EVM of the signal light output from the optical transmission apparatus, in which the first number of layers $n_1$ is 10 and a current of 100 mA flows through the first semiconductor optical amplifier, the relation being obtained by simulations.

Referring to FIGS. 4 to 9, the following describes combinations of the first number of layers $n_1$ and first length $L_1$, by which the EVM of signal light 5 output from optical transmission apparatus 1 reaches 10%. Referring to FIG. 4, when the first number of layers $n_1$ is 5, first length $L_1$ is 320 µm or more and 563 µm or less. Referring to FIG. 5, when the first number of layers $n_1$ is 6, first length $L_1$ is 470 µm or less. Referring to FIG. 6, when the first number of layers $n_1$ is 7, first length $L_1$ is 432 µm or less. Referring to FIG. 7, when the first number of layers $n_1$ is 8, first length $L_1$ is 397 µm or less. Referring to FIG. 8, when the first number of layers $n_1$ is 9, first length $L_1$ is 351 µm or less. Referring to FIG. 9, when the first number of layers $n_1$ is 10, first length $L_1$ is 297 µm or less.

Figure 10:
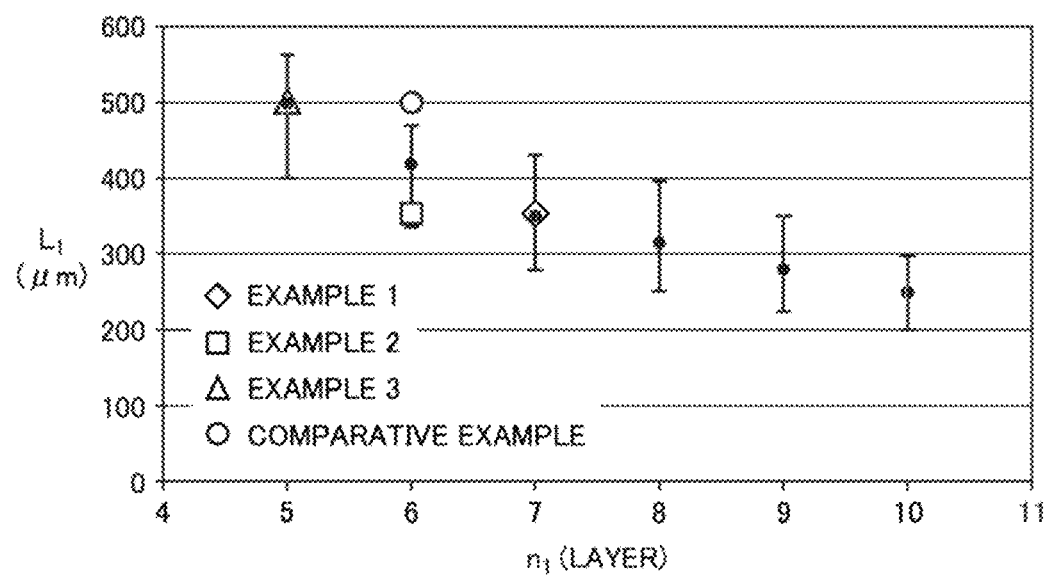
FIG. 10 is a graph showing the relation between a first number of layers $n_1$ of first well layers in a first active region of a first semiconductor optical amplifier and a first length $L_1$ of the first active region in each of Examples 1 to 3 and Comparative Example of the first embodiment and the third embodiment.

Referring to FIGS. 3 to 9, the combination of the first number of layers $n_1$ and first length $L_1$, by which an optical signal with improved quality and intensity can be output, is obtained by the range defined by the upper limit and the lower limit of each of the bars shown in FIG. 10. The upper limit of each of the bars is defined by 10% EVM of signal light 5 output from first semiconductor optical amplifier 30. The lower limit of each of the bars is defined by a gain of 8.8 dB in first semiconductor optical amplifier 30.

The combination of the first number of layers $n_1$ and first length $L_1$, by which the optical signal with improved quality and intensity can be output, is specifically: (a) $n_1=5$ and $400 \leq L_1 \leq 563$; (b) $n_1=6$ and $336 \leq L_1 \leq 470$; (c) $n_1=7$ and $280 \leq L_1 \leq 432$; (d) $n_1=8$ and $252 \leq L_1 \leq 397$; (e) $n_1=9$ and $224 \leq L_1 \leq 351$; or (f) $n_1=10$ and $200 \leq L_1 \leq 297$.

Specifically, the combination of the first number of layers $n_1$ and first length $L_1$ is obtained by the range defined by the upper limit of each of the bars and each of the black dots shown in FIG. 10. The upper limit of each of the bars is defined by 10% EVM of signal light 5 output from first semiconductor optical amplifier 30, and each of the black dots is defined by a gain of 11 dB in first semiconductor optical amplifier 30. Specifically, (g) $n_1=5$ and $500 \leq L_1 \leq 563$; (h) $n_1=6$ and $420 \leq L_1 \leq 470$; (i) $n_1=7$ and $350 \leq L_1 \leq 432$; (j) $n_1=8$ and $315 \leq L_1 \leq 397$; (k) $n_1=9$ and $280 \leq L_1 \leq 351$; or (l) $n_1=10$ and $250 \leq L_1 \leq 297$.

The combination of the first number of layers $n_1$ and first length $L_1$ may be $n_1=5$ and $400 \leq L_1 \leq 500$. The combination of the first number of layers $n_1$ and first length $L_1$ may be $n_1=6$ and $336 \leq L_1 \leq 400$, or may be $n_1=6$ and $350 \leq L_1 \leq 400$. The combination of the first number of layers $n_1$ and first length $L_1$ may be $n_1=7$ and $300 \leq L_1 \leq 400$. The combination of the first number of layers $n_1$ and first length $L_1$ may be $n_1=8$ and $300 \leq L_1 \leq 397$.

Figures 11, 12:
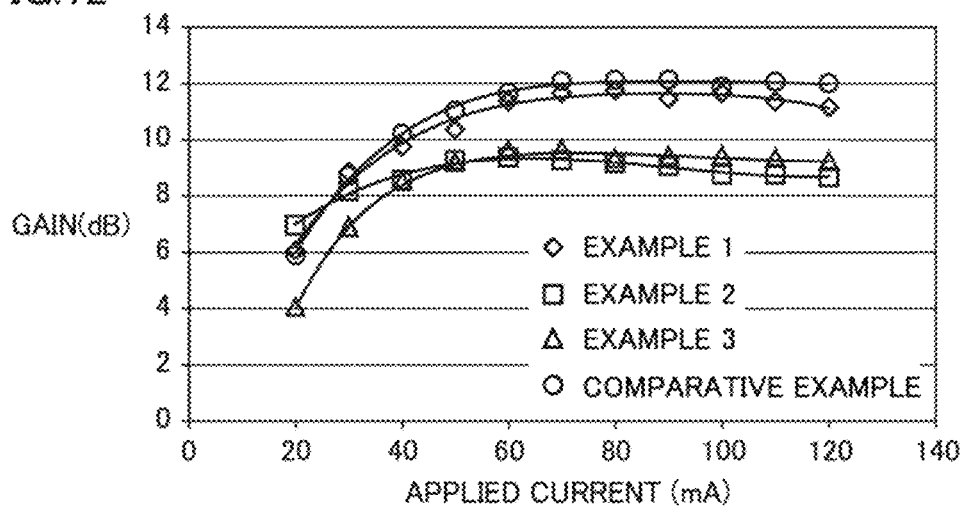
FIG. 11 is a table showing gains of the respective first semiconductor optical amplifiers and error vector magnitudes (EVM) of the respective optical transmission apparatuses in Examples 1 to 3 and Comparative Example of the first embodiment.
FIG. 12 is a graph showing the relation between an injection current and the gain of the first semiconductor optical amplifier in each of Examples 1 to 3 and Comparative Example of the first embodiment.

Referring to FIGS. 10 to 12, the following describes the effect of optical transmission apparatus 1 according to the present embodiment while explaining Examples 1 to 3 of the present embodiment as compared with Comparative Example. Examples 1 to 3 and Comparative Example are different from one another in: first length $L_1$ of first active region 32 in first semiconductor optical amplifier 30; and the first number of layers $n_1$ of the plurality of first well layers 32a in first semiconductor optical amplifier 30.

Specifically, as shown in FIG. 11, in first semiconductor optical amplifier 30 in optical transmission apparatus 1 in Example 1, the first number of layers $n_1$ of the plurality of first well layers 32a is seven and first length $L_1$ of first active region 32 is 350 µm. In first semiconductor optical amplifier 30 in optical transmission apparatus 1 in Example 2, the first number of layers $n_1$ of the plurality of first well layers 32a is six and first length $L_1$ of first active region 32 is 350 µm. In first semiconductor optical amplifier 30 in optical transmission apparatus 1 in Example 3, the first number of layers $n_1$ of the plurality of first well layers 32a is five and first length $L_1$ of first active region 32 is 500 µm. Further, in first semiconductor optical amplifier 30 in the optical transmission apparatus in Comparative Example, the first number of layers $n_1$ of the plurality of first well layers 32a is six and first length $L_1$ of first active region 32 is 500 µm.

In Examples 1 to 3 and Comparative Example, a current of 100 mA flows through first semiconductor optical amplifier 30. As shown in FIG. 12, in Examples 1 to 3 and Comparative Example, first semiconductor optical amplifier 30 operates in the gain saturation region. In Examples 1 to 3 and Comparative Example, first semiconductor optical amplifier 30 has a large gain of about 8 dB or more.

The quality of signal light 5 output from optical transmission apparatus 1 in each of Examples 1 to 3 and the quality of signal light 5 output from the optical transmission apparatus in Comparative Example were evaluated based on the error vector magnitude (EVM). It is to be noted that signal light 5 output from first multilevel optical phase modulator 10 (i.e., signal light 5 that has not yet been amplified by first semiconductor optical amplifier 30) has an EVM of 9.5%.

As shown in FIG. 11, signal light 5 output from optical transmission apparatus 1 in Example 1 has an EVM of 9.6%. In first semiconductor optical amplifier 30 in Example 1, the EVM deteriorates only by 0.1%. Signal light 5 output from optical transmission apparatus 1 in Example 2 has an EVM of 9.8%. In first semiconductor optical amplifier 30 in Example 2, the EVM deteriorates only by 0.3%. Signal light 5 output from optical transmission apparatus 1 in Example 3 has an EVM of 9.6%. In first semiconductor optical amplifier 30 in Example 3, the EVM deteriorates only by 0.1%. In this way, optical transmission apparatuses 1 in Examples 1 to 3 each have a relatively low error vector magnitude (EVM).

On the other hand, signal light 5 output from the optical transmission apparatus in Comparative Example has an EVM of 11.6%. In first semiconductor optical amplifier 30 in Comparative Example, the EVM deteriorates as much as by 2.1%. The optical transmission apparatus in Comparative Example has a relatively high EVM.

The above-described results in Examples 1 to 3 and Comparative Example are consistent with the simulation results shown in FIG. 10. Specifically, assuming that the first number of layers of the plurality of first well layers 32a is defined as $n_1$ and the first length of first active region 32 is defined as $L_1$ (μm), the combination may be: (a) $n_1=5$ and $400 \leq L_1 \leq 563$; (b) $n_1=6$ and $336 \leq L_1 \leq 470$; (c) $n_1=7$ and $280 \leq L_1 \leq 432$; (d) $n_1=8$ and $252 \leq L_1 \leq 397$; (e) $n_1=9$ and $224 \leq L_1 \leq 351$; or (f) $n_1=10$ and $200 \leq L_1 \leq 297$. In this case, optical transmission apparatus 1 can output an optical signal with improved quality and intensity.

The following describes the effects of optical transmission apparatus 1 according to the present embodiment.

Optical transmission apparatus 1 according to the present embodiment includes first multilevel optical phase modulator 10 and first semiconductor optical amplifier 30. First semiconductor optical amplifier 30 amplifies the first signal light (signal light 5) output from first multilevel optical phase modulator 10. First semiconductor optical amplifier 30 includes first active region 32. First active region 32 has a first multiple quantum well structure including a plurality of first well layers 32a. Assuming that the first number of layers of the plurality of first well layers 32a is defined as $n_1$ and the first length of first active region 32 is defined as $L_1$ (μm), (a) $n_1=5$ and $400 \leq L_1 \leq 563$, (b) $n_1=6$ and $336 \leq L_1 \leq 470$, (c) $n_1=7$ and $280 \leq L_1 \leq 432$, (d) $n_1=8$ and $252 \leq L_1 \leq 397$, (e) $n_1=9$ and $224 \leq L_1 \leq 351$, or (f) $n_1=10$ and $200 \leq L_1 \leq 297$. Thus, the quality and the intensity of the optical signal output from optical transmission apparatus 1 can be improved.

Since first length $L_1$ of first active region 32 is 563 μm or less, optical transmission apparatus 1 can be reduced in size. Optical transmission apparatus 1 can be manufactured at low cost. Further, the degree of reduction in power consumption of first semiconductor optical amplifier 30 that is caused by reduction in first length $L_1$ of first active region 32 is higher than the degree of reduction in power consumption of first semiconductor optical amplifier 30 that is caused by reduction in first number of layers $n_1$ of the plurality of first well layers 32a in first semiconductor optical amplifier 30. In the present embodiment, first semiconductor optical amplifier 30 is shorter in first length $L_1$ of first active region 32 and greater in first number of layers $n_1$ of the plurality of first well layers 32a of first semiconductor optical amplifier 30, for example, than a conventional semiconductor optical amplifier that includes an active region of 1 mm in length and four well layers. Accordingly, the power consumption of optical transmission apparatus 1 can be reduced.

Since the first number of layers $n_1$ of the plurality of first well layers 32a is 10 or less, carriers injected into first semiconductor optical amplifier 30 can be propagated through the entire first multiple quantum well structure, thereby preventing consumption of these carriers as heat. Thus, the gain of first semiconductor optical amplifier 30 can be improved while reducing the power consumption of optical transmission apparatus 1. Optical transmission apparatus 1 according to the present embodiment can be applicable to an optical transceiver conforming to Optical Internetworking Forum (OIF)-400ZR, which is a standard of an optical transceiver intended for a data center capable of operating at a data rate of 400 Gbit/s.

In optical transmission apparatus 1 according to the present embodiment, (g) $n_1=5$ and $500 \leq L_1 \leq 563$, (h) $n_1=6$ and $420 \leq L_1 \leq 470$, (i) $n_1=7$ and $350 \leq L_1 \leq 432$, (j) $n_1=8$ and $315 \leq L_1 \leq 397$, (k) $n_1=9$ and $280 \leq L_1 \leq 351$, or (l) $n_1=10$ and $250 \leq L_1 \leq 297$. Thus, the intensity of the optical signal output from optical transmission apparatus 1 can be further improved. Also, optical transmission apparatus 1 can be reduced in size. Optical transmission apparatus 1 can be manufactured at low cost. The power consumption of optical transmission apparatus 1 can be reduced.

Second Embodiment

Figure 13:
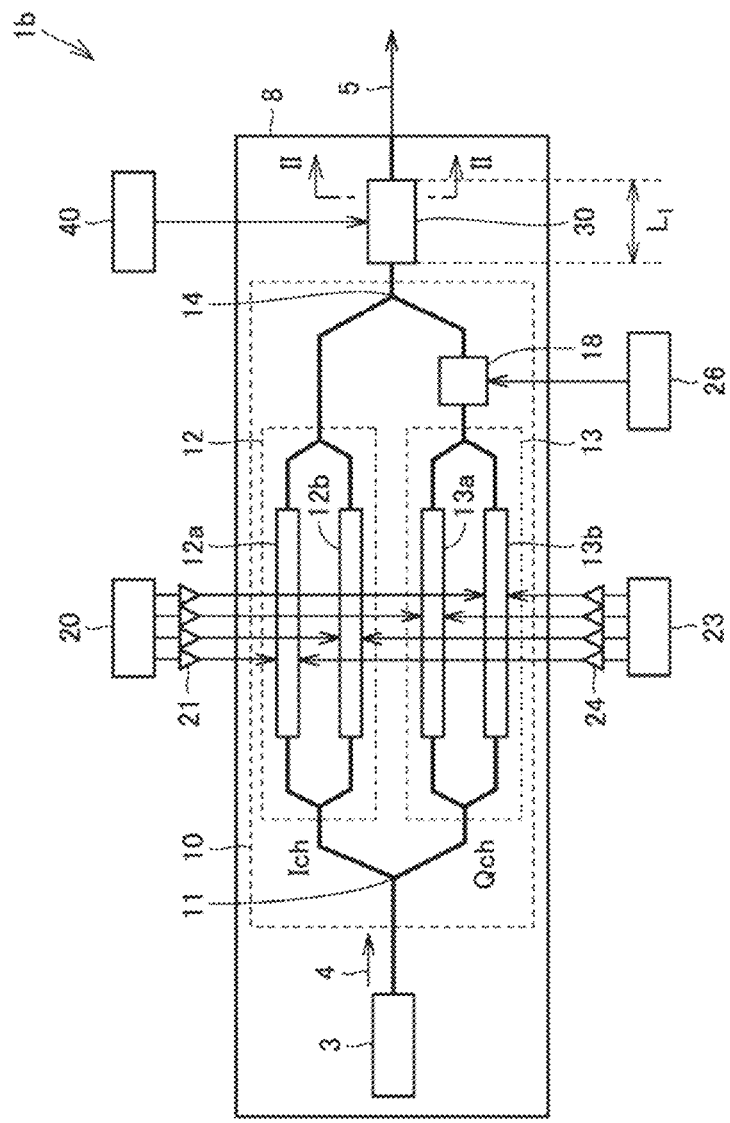
FIG. 13 is a schematic diagram of an optical transmission apparatus according to the second embodiment.

Referring to FIG. 13, an optical transmission apparatus 1b according to the second embodiment will be hereinafter described. Optical transmission apparatus 1b according to the present embodiment has the same configuration as that of optical transmission apparatus 1 according to the first embodiment, but is different therefrom mainly in the following points. In the present embodiment, in addition to first multilevel optical phase modulator 10 and first semiconductor optical amplifier 30, laser light source 3 as a semiconductor laser is also formed on one semiconductor substrate 8.

Optical transmission apparatus 1b according to the present embodiment achieves the following effects in addition to the effects achieved by optical transmission apparatus 1 according to the first embodiment. In the present embodiment, first multilevel optical phase modulator 10, first semiconductor optical amplifier 30, and a semiconductor laser (laser light source 3) are formed on one semiconductor substrate 8. Therefore, optical transmission apparatus 1b can be reduced in size. Optical transmission apparatus 1b can be manufactured at low cost. Also, the power consumption of optical transmission apparatus 1b can be reduced.

Third Embodiment

Figure 14:
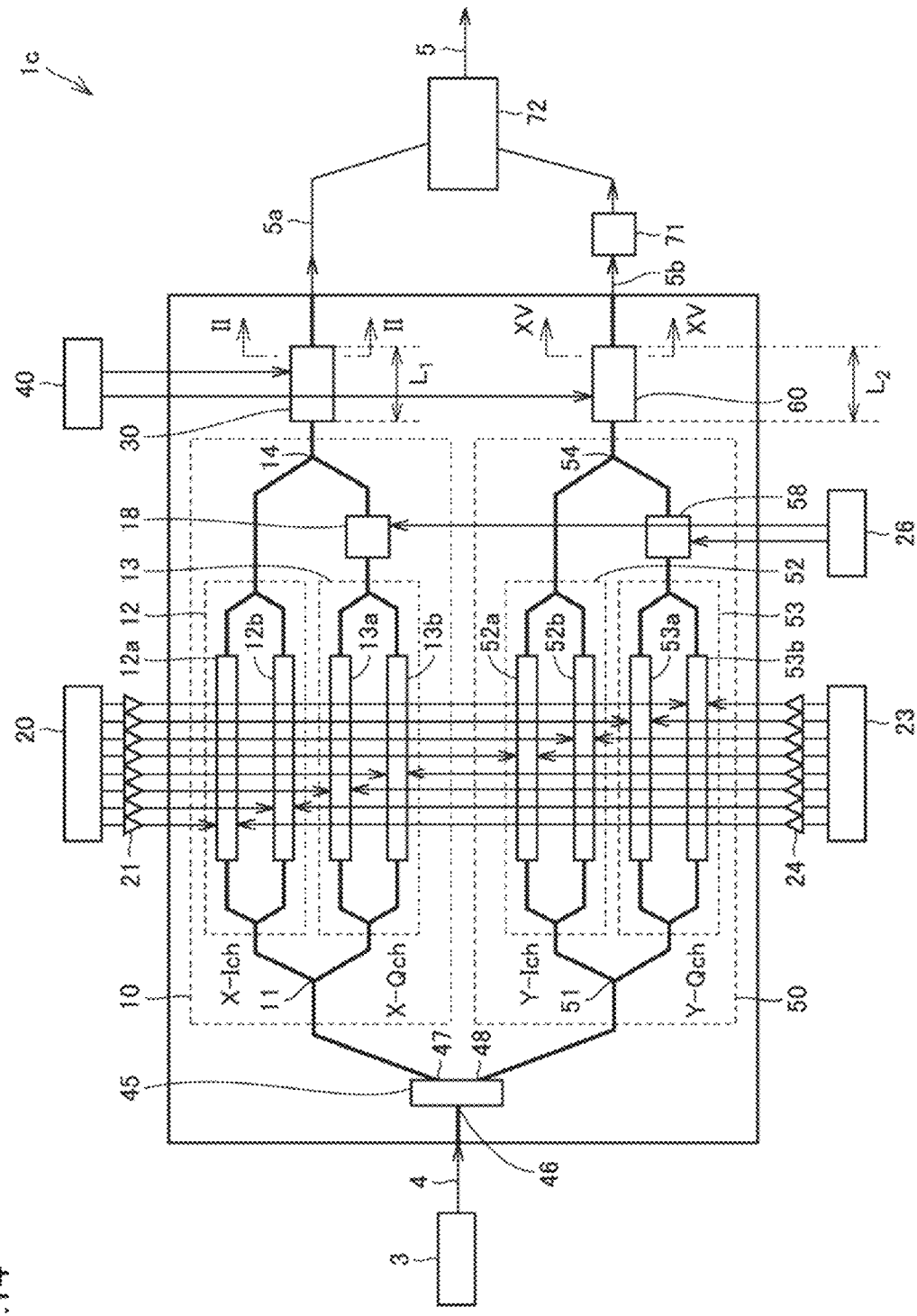
FIG. 14 is a schematic diagram of an optical transmission apparatus according to the third embodiment.

Referring to FIG. 14, an optical transmission apparatus 1c according to the third embodiment will be hereinafter described. Optical transmission apparatus 1c according to the present embodiment has the same configuration as that of optical transmission apparatus 1 according to the first embodiment, but is different therefrom mainly in the following points.

Optical transmission apparatus 1c further includes a second multilevel optical phase modulator 50, a second semiconductor optical amplifier 60, a third optical demultiplexer 45, a polarization rotation unit 71, and a third optical multiplexer 72. First multilevel optical phase modulator 10, second multilevel optical phase modulator 50, first semiconductor optical amplifier 30, second semiconductor optical amplifier 60, and third optical demultiplexer 45 may be formed on one semiconductor substrate 8. In the present embodiment, optical transmission apparatus 1c has a function of a DP-QAM modulator.

Third optical demultiplexer 45 serves as an optical demultiplexer that splits CW light 4 output from laser light source 3 into two beams of CW light 4. Third optical demultiplexer 45 includes an optical input portion 46, a first optical output portion 47, and a second optical output portion 48. Third optical demultiplexer 45 is, for example, a one-input and two-output (1×2) multimode interference (MMI) optical waveguide or a Y-branched optical waveguide. Third optical demultiplexer 45 is a semiconductor optical waveguide. CW light 4 output from laser light source 3 enters optical input portion 46 of third optical demultiplexer 45. First multilevel optical phase modulator 10 is optically connected to first optical output portion 47. Second multilevel optical phase modulator 50 is optically connected to second optical output portion 48. CW light 4 passes through third optical demultiplexer 45 and enters first multilevel optical phase modulator 10 and second multilevel optical phase modulator 50.

First optical demultiplexer 11 of first multilevel optical phase modulator 10 further splits CW light 4 output from third optical demultiplexer 45 into two beams of CW light 4. CW light 4 passes through first optical demultiplexer 11 and enters first Mach-Zehnder optical phase modulator 12 and second Mach-Zehnder optical phase modulator 13.

First Mach-Zehnder optical phase modulator 12 outputs first phase modulation light. The first phase modulation light is an Ich optical signal that is a real part of first signal light 5a of X-polarization. Second Mach-Zehnder optical phase modulator 13 outputs the second phase modulation light. The second phase modulation light is a Qch optical signal that is an imaginary part of first signal light 5a of X polarization. First optical multiplexer 14 multiplexes the first phase modulation light and the second phase modulation light that is adjusted in phase by first phase adjuster 18, and then, outputs first signal light 5a of X-polarization. First semiconductor optical amplifier 30 amplifies first signal light 5a.

Second multilevel optical phase modulator 50 includes a second optical demultiplexer 51, a third Mach-Zehnder optical phase modulator 52, a fourth Mach-Zehnder optical phase modulator 53, a second phase adjuster 58, and a second optical multiplexer 54.

Second optical demultiplexer 51 is an optical demultiplexer that further splits CW light 4 output from third optical demultiplexer 45 into two beams of CW light 4. Second optical demultiplexer 51 is, for example, a one-input and two-output (1×2) multimode interference (MMI) optical waveguide or a Y-branched optical waveguide. Second optical demultiplexer 51 is a semiconductor optical waveguide. CW light 4 passes through second optical demultiplexer 51 and enters third Mach-Zehnder optical phase modulator 52 and fourth Mach-Zehnder optical phase modulator 53.

Third Mach-Zehnder optical phase modulator 52 is connected to one of the optical output portions of second optical demultiplexer 51. Third Mach-Zehnder optical phase modulator 52 is a semiconductor Mach-Zehnder optical phase modulator. Third Mach-Zehnder optical phase modulator 52 includes a pair of third electrodes 52a, 52b. A third modulation signal is applied to the pair of third electrodes 52a, 52b from modulation signal generator 20. Third Mach-Zehnder optical phase modulator 52 may be driven in a single phase or may be differentially driven. The third modulation signal output from modulation signal generator 20 is amplified by first electric amplifier 21.

A third bias voltage is applied to the pair of third electrodes 52a, 52b from bias voltage controller 23. The third bias voltage output from bias voltage controller 23 is amplified by second electric amplifier 24. The third modulation signal and the third bias voltage change the phase of CW light 4 propagating through third Mach-Zehnder optical phase modulator 52. Third Mach-Zehnder optical phase modulator 52 outputs third phase modulation light. The third phase modulation light is an Ich optical signal that is a real part of second signal light 5b of Y polarization. Y polarization is different from X polarization by 90 degrees in the polarization direction.

Fourth Mach-Zehnder optical phase modulator 53 is connected to the other of the optical output portions of second optical demultiplexer 51. Fourth Mach-Zehnder optical phase modulator 53 is a semiconductor Mach-Zehnder optical phase modulator. Fourth Mach-Zehnder optical phase modulator 53 includes a pair of fourth electrodes 53a, 53b.

A fourth modulation signal is applied to the pair of fourth electrodes 53a, 53b from modulation signal generator 20. Fourth Mach-Zehnder optical phase modulator 53 may be driven in a single phase or may be differentially driven. The fourth modulation signal output from modulation signal generator 20 is amplified by first electric amplifier 21.

A fourth bias voltage is applied to the pair of fourth electrodes 53a, 53b from bias voltage controller 23. The fourth bias voltage output from bias voltage controller 23 is amplified by second electric amplifier 24. The fourth modulation signal and the fourth bias voltage change the phase of CW light 4 propagating through fourth Mach-Zehnder optical phase modulator 53. Fourth Mach-Zehnder optical phase modulator 53 outputs fourth phase modulation light. The fourth phase modulation light is a Qch optical signal that is an imaginary part of second signal light 5b of Y polarization.

Second phase adjuster 58 is disposed between fourth Mach-Zehnder optical phase modulator 53 and second optical multiplexer 54. Second phase adjuster 58 serves as an optical phase adjuster that provides a phase difference (for example, π/2) between the third phase modulation light and the fourth phase modulation light. A phase adjustment voltage is applied to second phase adjuster 58 from phase adjustment voltage controller 26. In the present embodiment, second phase adjuster 58 is provided between fourth Mach-Zehnder optical phase modulator 53 and second optical multiplexer 54, but second phase adjuster 58 may be provided between third Mach-Zehnder optical phase modulator 52 and second optical multiplexer 54, or second phase adjuster 58 may be provided between third Mach-Zehnder optical phase modulator 52 and second optical multiplexer 54 and between fourth Mach-Zehnder optical phase modulator 53 and second optical multiplexer 54.

Second optical multiplexer 54 is an optical multiplexer that multiplexes the third phase modulation light and the fourth phase modulation light. Second optical multiplexer 54 is, for example, a two-input and one-output (2×1) multimode interference (MMI) optical waveguide or a Y-junction multiplexing optical waveguide. Third Mach-Zehnder optical phase modulator 52 is connected to one of the optical input portions of second optical multiplexer 54. Fourth Mach-Zehnder optical phase modulator 53 is connected to the other of the optical input portions of second optical multiplexer 54. Second optical multiplexer 54 multiplexes the third phase modulation light and the fourth phase modulation light that is adjusted in phase by second phase adjuster 58, and then, outputs second signal light 5b of Y polarization. Second optical multiplexer 54 is a semiconductor optical waveguide.

Second semiconductor optical amplifier 60 is a semiconductor optical amplifier that amplifies second signal light 5b. Optical gain controller 40 controls the magnitude of the current injected into second semiconductor optical amplifier 60 to control the gain of second semiconductor optical amplifier 60. Optical gain controller 40 may operate second semiconductor optical amplifier 60, for example, in a gain saturation region of second semiconductor optical amplifier 60.

Figure 15:
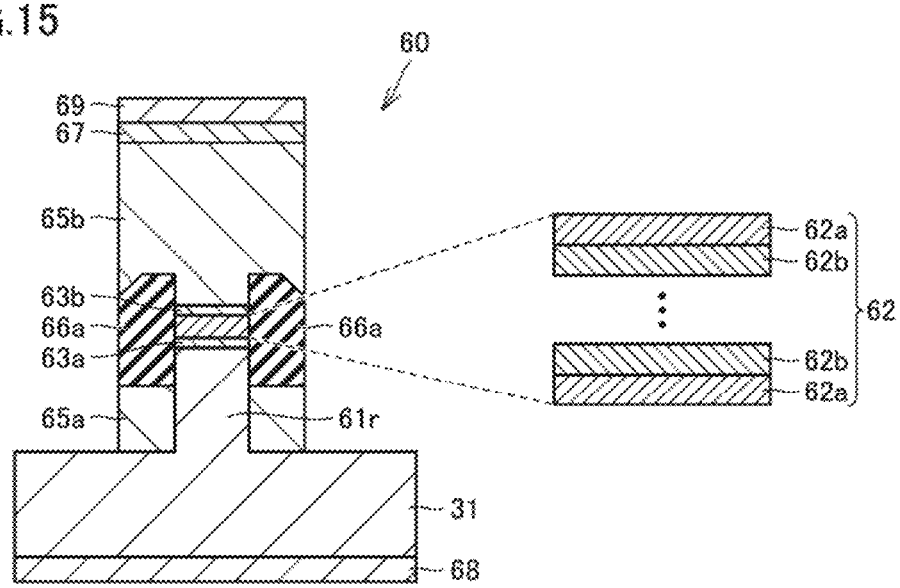
FIG. 15 is a schematic cross-sectional view of the optical transmission apparatus according to the third embodiment, which is taken along a cross-sectional line XV-XV shown in each of FIGS. 14 and 17.

Referring to FIG. 15, second semiconductor optical amplifier 60 has the same configuration as that of first semiconductor optical amplifier 30. Second semiconductor optical amplifier 60 includes, for example, an n-type semiconductor layer 31, a pair of light confinement layers 63a, 63b, a second active region 62, p-type semiconductor layers 65a, 65b, current blocking layers 66a, 66b, a p-type contact layer 67, an n-type electrode 68, and a p-type electrode 69. N-type semiconductor layer 31 may be a part of semiconductor substrate 8. N-type semiconductor layer 31 is an n-InP layer, for example. N-type semiconductor layer 31 includes a ridge portion 61*r*.

Light confinement layer 63*a* is provided on ridge portion 61*r*. Second active region 62 is provided on light confinement layer 63*a*. Light confinement layer 63*b* is provided on second active region 62. Second active region 62 is sandwiched between the pair of light confinement layers 63*a*, 63*b*. The pair of light confinement layers 63*a*, 63*b* confines second signal light 5*b*, which propagates through second semiconductor optical amplifier 60, mainly in the pair of light confinement layers 63*a*, 63*b* and second active region 62.

P-type semiconductor layer 65*b* is provided on light confinement layer 63*b*. Both sides of a portion of ridge portion 61*r* proximate to n-type semiconductor layer 31 are embedded by p-type semiconductor layer 65*a*. P-type semiconductor layers 65*a*, 65*b* are p-InP layers, for example. Current blocking layers 66*a* are provided on p-type semiconductor layer 65*a*. The remaining portion of ridge portion 61*r*, the pair of light confinement layers 63*a*, 63*b*, second active region 62, and both sides of a portion of p-type semiconductor layer 65*b* are embedded by current blocking layers 66*a*. Current blocking layers 66*a* concentrate the current, which flows between n-type electrode 68 and p-type electrode 69, in second active region 62. Current blocking layers 66*a* are n-InP layers or Fe-doped InP layers.

P-type semiconductor layer 65*b* is provided also on current blocking layers 66*a*. P-type contact layer 67 is provided on p-type semiconductor layer 65*b*. P-type contact layer 67 is a p-InGaAs layer. N-type electrode 68 is provided on the back surface of n-type semiconductor layer 31 (on the surface of n-type semiconductor layer 31 that is distant from second active region 62). P-type electrode 69 is provided on p-type contact layer 67. P-type electrode 69 is in ohmic contact with p-type contact layer 67.

Second active region 62 has a second length $L_2$ (see FIG. 14) extending in the direction along which second signal light 5*b* propagates. Second length $L_2$ of second active region 62 is equal, for example, to the length of second semiconductor optical amplifier 60 extending in the direction along which second signal light 5*b* propagates. Second active region 62 includes a second multiple quantum well (MQW) structure. The second multiple quantum well structure includes a plurality of second well layers 62*a* and a plurality of second barrier layers 62*b*. The material of second well layer 62*a* is undoped InGaAsP, for example. The material of second barrier layer 62*b* is undoped InGaAsP, for example. The band gap energy of second well layer 62*a* is smaller than the band gap energy of second barrier layer 62*b*.

The quality and the light intensity of signal light 5 output from optical transmission apparatus 1*c* depend also on the second number of layers $n_2$ of the plurality of second well layers 62*a* in second semiconductor optical amplifier 60 and second length $L_2$ (μm) of second active region 62. The combination of the second number of layers $n_2$ and second length $L_2$, by which an optical signal with improved quality and intensity can be output, is obtained by the range defined by the upper limit and the lower limit of each of bars shown in FIG. 16. The upper limit of each of the bars is defined by 10% EVM of second signal light 5*b* output from second semiconductor optical amplifier 60. The lower limit of each of the bars is defined by a gain of 8.8 dB in second semiconductor optical amplifier 60.

The combination of the second number of layers $n_2$ and second length $L_2$ by which an optical signal with improved quality and intensity can be output is specifically: (m) $n_2=5$ and $400 \leq L_2 \leq 563$; (n) $n_2=6$ and $336 \leq L_2 \leq 470$; (o) $n_2=7$ and $280 \leq L_2 \leq 432$; (p) $n_2=8$ and $252 \leq L_2 \leq 397$; (q) $n_2=9$ and $224 \leq L_2 \leq 351$; or (r) $n_2=10$ and $200 \leq L_2 \leq 297$.

Figure 16:
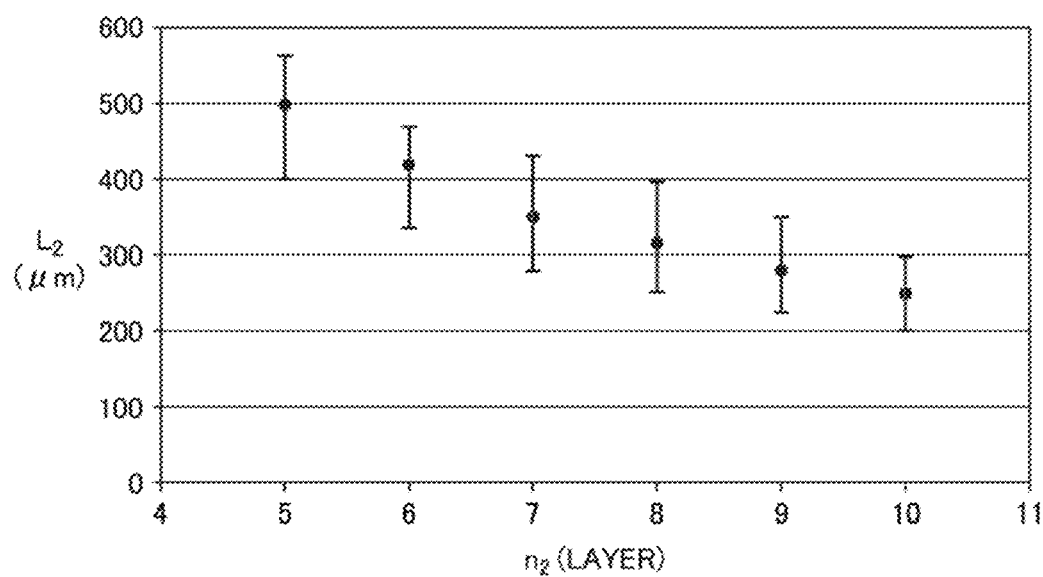
FIG. 16 is a graph showing the relation between a second number of layers $n_2$ of second well layers in a second active region of a second semiconductor optical amplifier and a second length $L_2$ of the second active region according to the third embodiment.

Specifically, the combination of the second number of layers $n_2$ and second length $L_2$ is obtained by the range defined by the upper limit of each of the bars and each of the black dots shown in FIG. 16. The upper limit of each of the bars is defined by 10% EVM of second signal light 5*b* output from second semiconductor optical amplifier 60. Each of the black dots is defined by a gain of 11 dB in second semiconductor optical amplifier 60. Specifically, (s) $n_2=5$ and $500 \leq L_2 \leq 563$; (t) $n_2=6$ and $420 \leq L_2 \leq 470$; (u) $n_2=7$ and $350 \leq L_2 \leq 432$; (v) $n_2=8$ and $315 \leq L_2 \leq 397$; (w) $n_2=9$ and $280 \leq L_2 \leq 351$; or (x) $n_2=10$ and $250 \leq L_2 \leq 297$.

The combination of the second number of layers $n_2$ and second length $L_2$ may be $n_2=5$ and $400 \leq L_2 \leq 500$. The combination of the second number of layers $n_2$ and second length $L_2$ may be $n_2=6$ and $336 \leq L_2 \leq 400$, or may be $n_2=6$ and $350 \leq L_2 \leq 400$. The combination of the second number of layers $n_2$ and second length $L_2$ may be $n_2=7$ and $300 \leq L_2 \leq 400$. The combination of the second number of layers $n_2$ and second length $L_2$ may be $n_2=8$ and $300 \leq L_2 \leq 397$.

The number of second layers $n_2$ of the plurality of second well layers 62*a* in second semiconductor optical amplifier 60 may be equal to the first number of layers $n_1$ of the plurality of first well layers 32*a* in first semiconductor optical amplifier 30. Also, second length $L_2$ (μm) of second active region 62 in second semiconductor optical amplifier 60 may be equal to first length $L_1$ (μm) of first active region 32 in first semiconductor optical amplifier 30. The number of second layers $n_2$ of the plurality of second well layers 62*a* in second semiconductor optical amplifier 60 may be different from the first number of layers $n_1$ of the plurality of first well layers 32*a* in first semiconductor optical amplifier 30. Second length $L_2$ (μm) of second active region 62 in second semiconductor optical amplifier 60 may be different from first length $L_1$ (μm) of first active region 32 in first semiconductor optical amplifier 30.

Polarization rotation unit 71 rotates, by 90 degrees, the polarization direction of second signal light 5*b* amplified by second semiconductor optical amplifier 60. Polarization rotation unit 71 is a half-wave plate, for example. Third optical multiplexer 72 multiplexes first signal light 5*a* and second signal light 5*b*, and then, outputs signal light 5. Thus, optical transmission apparatus 1*c* outputs signal light 5 that is an optical signal.

Optical transmission apparatus 1*c* according to the present embodiment achieves the following effects in addition to the effects achieved by optical transmission apparatus 1 according to the first embodiment.

Optical transmission apparatus 1*c* according to the present embodiment further includes an optical demultiplexer (third optical demultiplexer 45), a second multilevel optical phase modulator 50, and a second semiconductor optical amplifier 60. The optical demultiplexer (third optical demultiplexer 45) includes an optical input portion 46, a first optical output portion 47, and a second optical output portion 48. Second semiconductor optical amplifier 60 amplifies second signal light 5*b* output from second multilevel optical phase modulator 50. First multilevel optical phase modulator 10 is optically connected to first optical output portion 47. Second multilevel optical phase modulator 50 is optically connected to second optical output portion 48. Second semiconductor optical amplifier 60 includes a second active region 62. Second active region 62 has a second multiple quantum well structure including a plurality of second well layers 62a. Assuming that the second number of layers of the plurality of second well layers 62a is defined as $n_2$ and the second length of second active region 62 is defined as $L_2$ (μm), then, (m) $n_2$=5 and 400≤$L_2$≤563; (n) $n_2$=6 and 336≤$L_2$≤470; (o) $n_2$=7 and 280≤$L_2$≤432; (p) $n_2$=8 and 252≤$L_2$≤397; (q) $n_2$=9 and 224≤$L_2$≤351; or (r) $n_2$=10 and 200≤$L_2$≤297. Thus, the quality and the intensity of the optical signal output from optical transmission apparatus 1c can be improved.

Since second length $L_2$ of second active region 62 is 563 μm or less, optical transmission apparatus 1c can be reduced in size. Optical transmission apparatus 1c can be manufactured at low cost. Further, the degree of reduction in power consumption of second semiconductor optical amplifier 60 that is caused by reduction in second length $L_2$ of second active region 62 is higher than the degree of reduction in power consumption of second semiconductor optical amplifier 60 that is caused by reduction in number of second layers $n_2$ of the plurality of second well layers 62a in second semiconductor optical amplifier 60. In the present embodiment, second semiconductor optical amplifier 60 is shorter in second length $L_2$ of second active region 62 and larger in number of second layers $n_2$ of the plurality of second well layers 62a in second semiconductor optical amplifier 60, for example, than a conventional semiconductor optical amplifier including an active region of 1 mm in length and four well layers. Therefore, the power consumption of optical transmission apparatus 1c can be reduced.

Since the second number of layers $n_2$ of the plurality of second well layers 62a is 10 or less, the carriers injected into second semiconductor optical amplifier 60 can be propagated through the entire second multiple quantum well structure, thereby preventing consumption of these carriers as heat. Thus, the gain of second semiconductor optical amplifier 60 can be improved while reducing the power consumption of optical transmission apparatus 1c. Optical transmission apparatus 1c can increase the multilevel degree of the optical signal. Optical transmission apparatus 1c according to the present embodiment can be applicable to an optical transceiver conforming to Optical Internetworking Forum (OIF)-400ZR, which is a standard of an optical transceiver intended for a data center capable of operating at a data rate of 400 Gbit/s.

In optical transmission apparatus 1c according to the present embodiment, (s) $n_2$=5 and 500≤$L_2$ 563, (t) $n_2$=6 and 420≤$L_2$≤470, (u) $n_2$=7 and 350≤$L_2$≤432, (v) $n_2$=8 and 315≤$L_2$≤397, (w) $n_2$=9 and 280≤$L_2$≤351, or (x) $n_2$=10 and 250≤$L_2$≤297. Thus, the intensity of the optical signal output from optical transmission apparatus 1c can be further improved. Also, optical transmission apparatus 1c can be reduced in size. Optical transmission apparatus 1c can be manufactured at low cost. The power consumption of optical transmission apparatus 1c can be reduced.

In optical transmission apparatus 1c according to the present embodiment, the number of second layers $n_2$ of the plurality of second well layers 62a in second semiconductor optical amplifier 60 may be equal to the first number of layers $n_1$ of the plurality of first well layers 32a in first semiconductor optical amplifier 30. Also, second length $L_2$ (μm) of second active region 62 in second semiconductor optical amplifier 60 may be equal to first length $L_1$ (μm) of first active region 32 in first semiconductor optical amplifier 30. Thus, the first optical amplification characteristics of first semiconductor optical amplifier 30 can be set to conform to the second optical amplification characteristics of second semiconductor optical amplifier 60. The control for first semiconductor optical amplifier 30 and second semiconductor optical amplifier 60 using optical gain controller 40 can be simplified. Also, first semiconductor optical amplifier 30 and second semiconductor optical amplifier 60 can be formed in the same process. Thus, the manufacturing cost for optical transmission apparatus 1c can be reduced.

Fourth Embodiment

Figure 17:
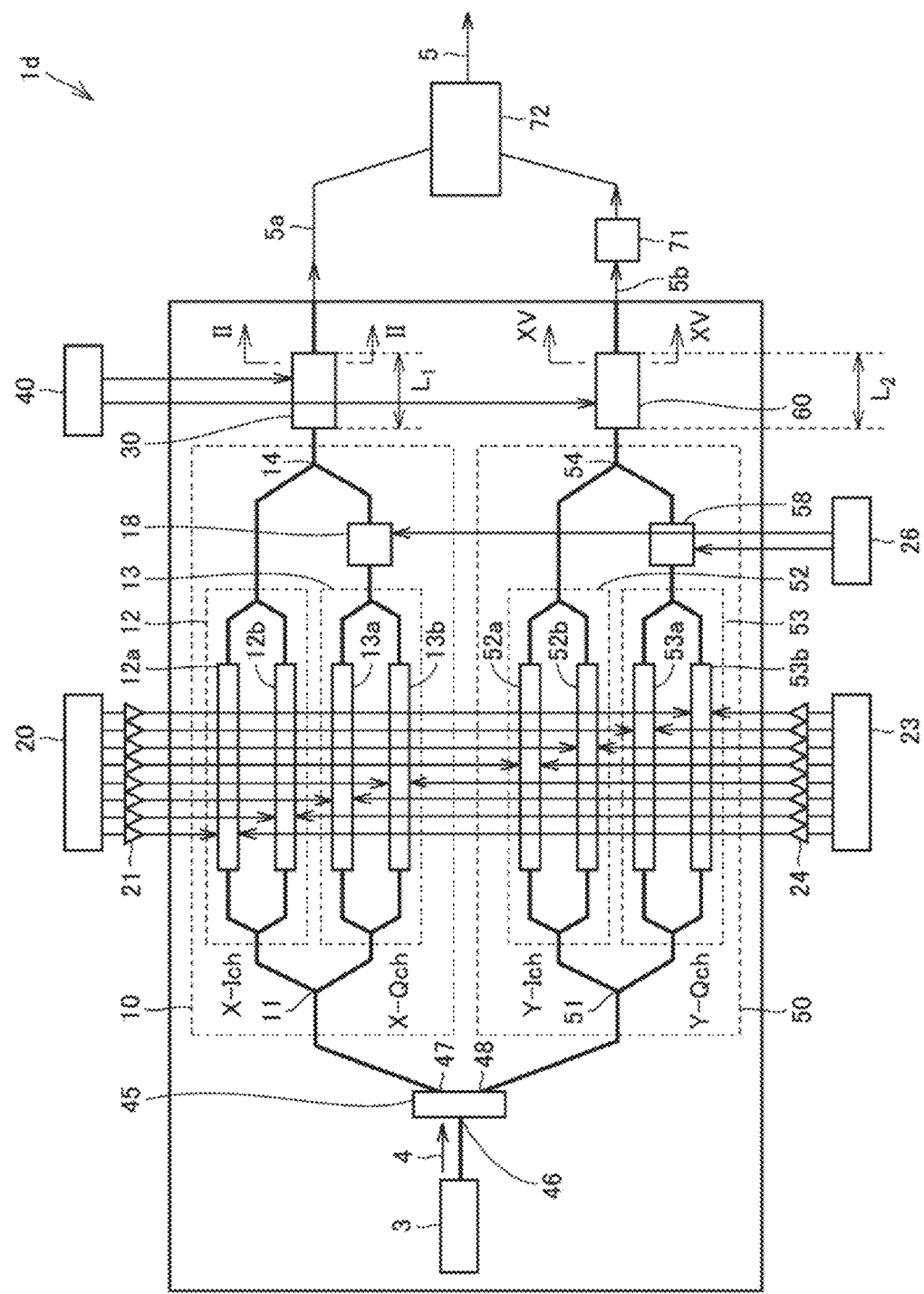
FIG. 17 is a schematic diagram of an optical transmission apparatus according to the fourth embodiment.

Referring to FIG. 17, an optical transmission apparatus 1d according to the fourth embodiment will be hereinafter described. Optical transmission apparatus 1d according to the present embodiment has the same configuration as that of optical transmission apparatus 1c according to the third embodiment, but is different therefrom mainly in the following points. In the present embodiment, in addition to first multilevel optical phase modulator 10, second multilevel optical phase modulator 50, first semiconductor optical amplifier 30, and second semiconductor optical amplifier 60, laser light source 3 that is a semiconductor laser is also formed on one semiconductor substrate 8.

Optical transmission apparatus 1d according to the present embodiment achieves the following effects in addition to the effects achieved by optical transmission apparatus 1c according to the third embodiment. In the present embodiment, first multilevel optical phase modulator 10, second multilevel optical phase modulator 50, first semiconductor optical amplifier 30, second semiconductor optical amplifier 60, and a semiconductor laser (laser light source 3) are formed on one semiconductor substrate 8. Thus, optical transmission apparatus 1d can be reduced in size. Optical transmission apparatus 1d can be manufactured at low cost. The power consumption of optical transmission apparatus 1d can be reduced.

It should be understood that the first to fourth embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 1, 1b, 1c, 1d optical transmission apparatus, 3 laser light source, 4 CW light, 5 signal light, 5a first signal light, 5b second signal light, 8 semiconductor substrate, 10 first multilevel optical phase modulator, 11 first optical demultiplexer, 12 first Mach-Zehnder optical phase modulator, 12a, 12b first electrode, 13 second Mach-Zehnder optical phase modulator, 13a, 13b second electrode, 14 first optical multiplexer, 18 first phase adjuster, 20 modulation signal generator, 21 first electric amplifier, 23 bias voltage controller, 24 second electric amplifier, 26 phase adjustment voltage controller, 30 first semiconductor optical amplifier, 31 n-type semiconductor layer, 31r, 61r ridge portion, 32 first active region, 32a first well layer, 32b first barrier layer, 33a, 33b, 63a, 63b light confinement layer, 35a, 35b, 65a, 65b p-type semiconductor layer, 36a, 66a current blocking layer, 37, 67 p-type contact layer, 38, 68 n-type electrode, 39, 69 p-type electrode, 40 optical gain controller, 41, 42, 76, 77 region, 45 third optical demultiplexer, 46 optical input portion, 47 first optical output portion, 48 second optical output portion, 50 second multilevel optical phase modulator, 51 second optical demultiplexer, 52 third Mach-Zehnder optical phase modulator, 52a, 52b third electrode, 53 fourth Mach-Zehnder optical phase modulator, 53a, 53b fourth electrode, 54 second optical multiplexer, 58 second phase adjuster, 60 second semiconductor optical amplifier, 62 second active region, 62*a* second well layer, 62*b* second barrier layer, 71 polarization rotation unit, 72 third optical multiplexer.

The invention claimed is:
1. An optical transmission apparatus comprising:
a first multilevel optical phase modulator; and
a first semiconductor optical amplifier to amplify first multilevel optical signal lights output from the first multilevel optical phase modulator, wherein
the first semiconductor optical amplifier includes a first active region, and the first active region has a first multiple quantum well structure,
wherein a first number of all well layers of the first multiple quantum well structure is defined as $n_1$ and a first length of the first active region is defined as $L_1$ (μm),

$n_1=5$ and $400 \leq L_1 \leq 563$, $n_1=6$ and $336 \leq L_1 \leq 470$, $n_1=7$ and $280 \leq L_1 \leq 432$, $n_1=8$ and $252 \leq L_1 \leq 397$, $n_1=9$ and $224 \leq L_1 \leq 351$, or $n_1=10$ and $200 \leq L_1 \leq 297$.

2. The optical transmission apparatus according to claim 1, wherein $n_1=5$ and $500 \leq L_1 \leq 563$, $n_1=6$ and $420 \leq L_1 \leq 470$, $n_1=7$ and $350 \leq L_1 \leq 432$, $n_1=8$ and $315 \leq L_1 \leq 397$, $n_1=9$ and $280 \leq L_1 \leq 351$, or $n_1=10$ and $250 \leq L_1 \leq 297$.

3. The optical transmission apparatus according to claim 1, wherein $n_1=5$ and $400 \leq L_1 \leq 500$, $n_1=6$ and $336 \leq L_1 \leq 400$, $n_1=7$ and $300 \leq L_1 \leq 400$, or $n_1=8$ and $300 \leq L_1 \leq 397$.

4. The optical transmission apparatus according to claim 1, wherein the first semiconductor optical amplifier is controlled to operate in a gain saturation region of the first semiconductor optical amplifier.

5. The optical transmission apparatus according to claim 1, further comprising a semiconductor laser to output light to the first multilevel optical phase modulator, wherein
the first multilevel optical phase modulator, the first semiconductor optical amplifier, and the semiconductor laser are formed on a single semiconductor substrate.

6. The optical transmission apparatus according to claim 1, further comprising:
an optical demultiplexer including an optical input portion, a first optical output portion, and a second optical output portion;
a second multilevel optical phase modulator; and
a second semiconductor optical amplifier to amplify second multilevel optical signal lights output from the second multilevel optical phase modulator, wherein
the first multilevel optical phase modulator is optically connected to the first optical output portion,
the second multilevel optical phase modulator is optically connected to the second optical output portion,
the second semiconductor optical amplifier includes a second active region, and the second active region has a second multiple quantum well structure, and
wherein a second number of all well layers of the second multiple quantum well structure is defined as $n_2$ and a second length of the second active region is defined as $L_2$ (μm), $n_2=5$ and $400 \leq L_2 \leq 563$, $n_2=6$ and $336 \leq L_2 \leq 470$, $n_2=7$ and $280 \leq L_2 \leq 432$, $n_2=8$ and $252 \leq L_2 \leq 397$, $n_2=9$ and $224 \leq L_2 \leq 351$, or $n_2=10$ and $200 \leq L_2 \leq 297$.

7. The optical transmission apparatus according to claim 6, wherein $n_2=5$ and $500 \leq L_2 \leq 563$, $n_2=6$ and $420 \leq L_2 \leq 470$, $n_2=7$ and $350 \leq L_2 \leq 432$, $n_2=8$ and $315 \leq L_2 \leq 397$, $n_2=9$ and $280 \leq L_2 \leq 351$, or $n_2=10$ and $250 \leq L_2 \leq 297$.

8. The optical transmission apparatus according to claim 6, wherein $n_2=5$ and $400 \leq L_2 \leq 500$, $n_2=6$ and $336 \leq L_2 \leq 400$, $n_2=7$ and $300 \leq L_2 \leq 400$, or $n_2=8$ and $300 \leq L_2 \leq 397$.

9. The optical transmission apparatus according to claim 6, wherein
the second number of layers $n_2$ is equal to the first number of layers $n_1$, and
the second length $L_2$ (μm) is equal to the first length $L_1$ (μm).

10. The optical transmission apparatus according to claim 6, wherein the second semiconductor optical amplifier is controlled to operate in a gain saturation region of the second semiconductor optical amplifier.

11. The optical transmission apparatus according to claim 6, further comprising a semiconductor laser to output light to the optical input portion, wherein
the first multilevel optical phase modulator, the first semiconductor optical amplifier, the optical demultiplexer, and the semiconductor laser are formed on a single semiconductor substrate.

* * * * *